US009209337B2

(12) United States Patent
Jeon et al.

(10) Patent No.: US 9,209,337 B2
(45) Date of Patent: Dec. 8, 2015

(54) PHOTOSENSING TRANSISTORS, METHODS OF MANUFACTURING THE SAME, AND DISPLAY PANELS EMPLOYING A PHOTOSENSING TRANSISTOR

(75) Inventors: Sang-hun Jeon, Seoul (KR); I-hun Song, Hwaseong-si (KR); Seung-eon Ahn, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 163 days.

(21) Appl. No.: 13/607,019

(22) Filed: Sep. 7, 2012

(65) Prior Publication Data
US 2013/0241881 A1 Sep. 19, 2013

(30) Foreign Application Priority Data

Mar. 13, 2012 (KR) .................. 10-2012-0025666

(51) Int. Cl.
G06F 3/042 (2006.01)
H01L 31/113 (2006.01)
H01L 31/032 (2006.01)
G01J 1/42 (2006.01)
G01J 1/44 (2006.01)

(52) U.S. Cl.
CPC .............. *H01L 31/1136* (2013.01); *G01J 1/42* (2013.01); *G06F 3/0421* (2013.01); *H01L 31/032* (2013.01); *G01J 2001/4473* (2013.01); *G06F 2203/04103* (2013.01)

(58) Field of Classification Search
CPC combination set(s) only.
See application file for complete search history.

(56) References Cited

U.S. PATENT DOCUMENTS

| 6,034,725 | A | * | 3/2000 | Franklin et al. | 348/310 |
| 6,259,202 | B1 | * | 7/2001 | Sturm et al. | 313/504 |
| 2008/0157136 | A1 | | 7/2008 | Matsumoto et al. | |
| 2010/0155731 | A1 | * | 6/2010 | Sun et al. | 257/59 |
| 2010/0276689 | A1 | * | 11/2010 | Iwasaki | 257/43 |
| 2011/0127518 | A1 | * | 6/2011 | Jung et al. | 257/43 |
| 2011/0310381 | A1 | * | 12/2011 | Kamata | 356/218 |

FOREIGN PATENT DOCUMENTS

| JP | S61-79269 A | 4/1986 |
| KR | 20070004589 A | 1/2007 |
| KR | 20090058743 A | 6/2009 |
| KR | 20100012783 U | 2/2010 |

(Continued)

OTHER PUBLICATIONS

Sato, Ayumu et al. "Amorphous In—Ga—Zn—O coplanar homojunction thin-film transistor" Applied Physics Letters 94, 133502 (2009).

(Continued)

*Primary Examiner* — Dwayne Bost
*Assistant Examiner* — Robert Michaud
(74) *Attorney, Agent, or Firm* — Harness, Dickey & Pierce, P.L.C.

(57) ABSTRACT

Photosensing transistors, display panels employing a photosensing transistor, and methods of manufacturing the same, include a gate layer, a gate insulation layer on the gate layer, a channel layer on the gate insulation layer, an etch stop layer on a partial area of the channel layer, a source and a drain on the channel layer and separated from each other with the etch stop layer being interposed between the source and the drain, and a passivation layer covering the source, the drain, and the etch stop layer, wherein the source is separated from the etch stop layer.

20 Claims, 8 Drawing Sheets

(56) References Cited

FOREIGN PATENT DOCUMENTS

| KR | 20110123116 A | 11/2011 |
| KR | 20130058405 A | 6/2013 |

OTHER PUBLICATIONS

Yabuta, Hisato et al. "High-mobility thin-film transistor with amorphous InGaZnO4 channel fabricated by room temperature if-magnetron sputtering." *Applied Physics Letters* 89, 112123 (2006).

Sanjoh, A. et al. "Off current characteristics of amorphous silicon thin film transistors under gate-side illumination." *Thin Solid Films, 208*(1). 1992. XP025851878.

Extended European Search Report dated Jun. 29, 2015 for corresponding EP Application No. 12191754.6.

* cited by examiner

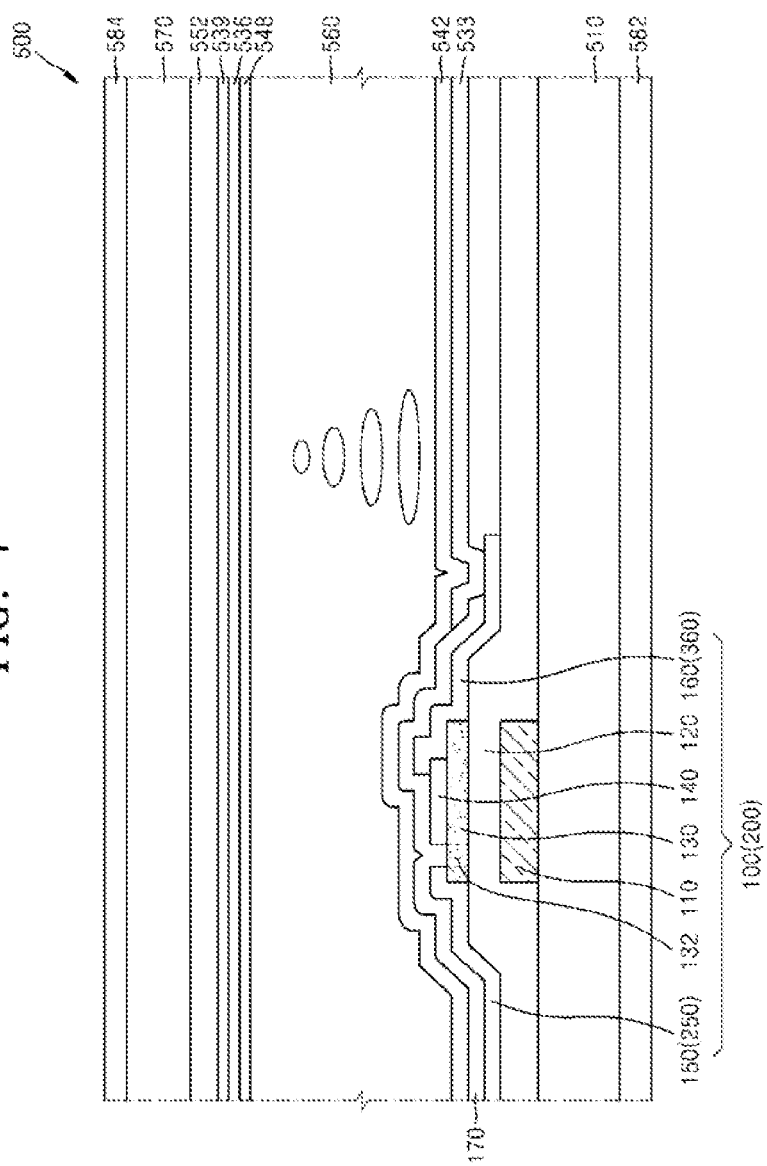

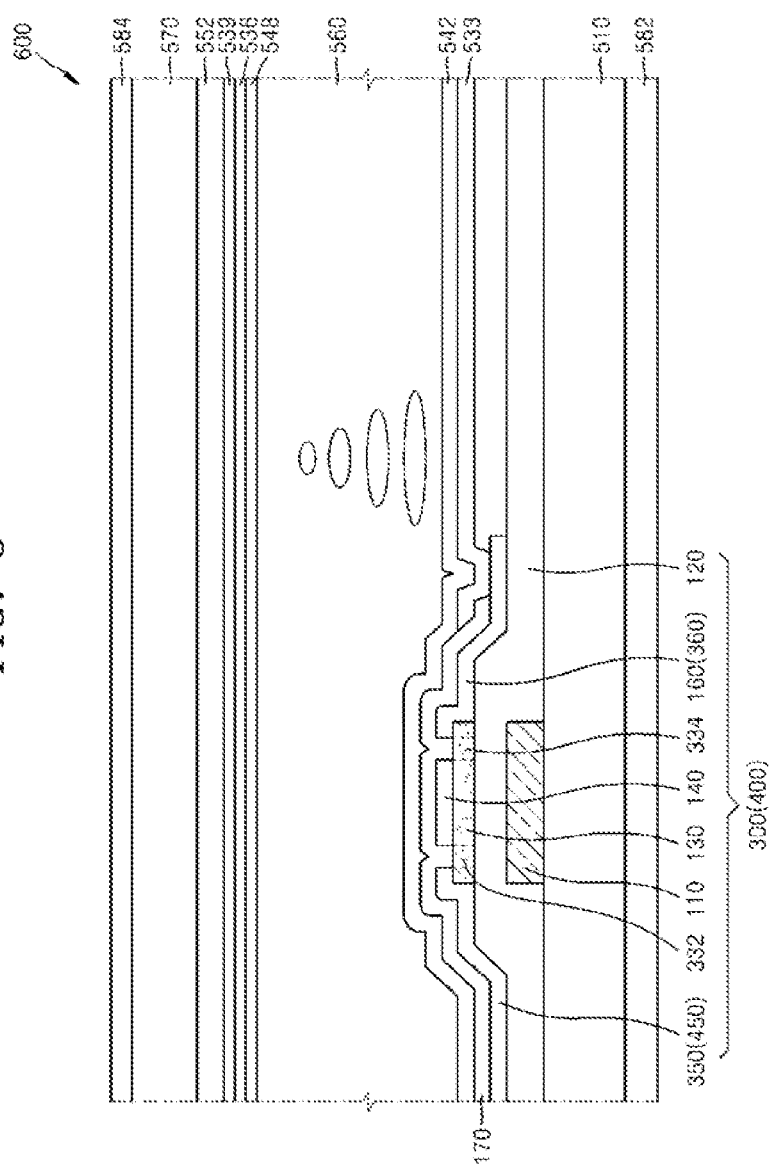

PHOTOSENSING TRANSISTORS, METHODS OF MANUFACTURING THE SAME, AND DISPLAY PANELS EMPLOYING A PHOTOSENSING TRANSISTOR

CROSS-REFERENCE TO RELATED APPLICATIONS

This application claims the benefit of priority under 35 U.S.C. §119(e) from Korean Patent Application No. 10-2012-0025666, filed on Mar. 13, 2012, in the Korean Intellectual Property Office, the disclosure of which is incorporated herein by reference in its entirety.

BACKGROUND

1. Field

Example embodiments relate to photosensing transistors, methods of manufacturing the same, and display panels employing a photosensing transistor.

2. Description of the Related Art

Thin film transistors are widely used in a variety of fields, in particular, as a switching and driving device in a display field. Recently, using a thin film transistor as a photosensing element for an optical touch screen device has been suggested. A touch screen device is a device for directly inputting data on a screen. In other words, when a user's finger, or a stylus (e.g., pen), touches a particular location on a display screen of a touch screen device, a set process is performed using software.

Currently, widely used touch screen devices use a method of directly touching a screen of a display device by using a finger or a pen. However, as the size of a display device increases, a distance between a user and a display device increases and thus it may be difficult to use the direct touch method. An optical touch screen device is a device that performs the same function as a conventional touch screen by sensing light instead of contact by a finger or a pen. The optical touch screen device is expected to be useful not only for communications between a user and a terminal but also for communication between users.

When a photosensing transistor is used in an optical touch screen device and a liquid crystal panel is used as a display panel, input light passes through a polarization film and is incident on a photosensing transistor. A light loss occurs while the light passes through the polarization film. Also, a degree of light loss varies according to an incident angle. Photocurrent is reduced by about 10% with respect to a particular incident angle so that a photosensing transistor may not react to incident light. Thus, there is a demand to study about a solution to improve photosensing efficiency.

SUMMARY

Example embodiments relate to photosensing transistors, methods of manufacturing the same, and display panels employing a photosensing transistor.

Provided are methods and apparatuses for a photosensing transistor having a structure in which a channel layer of the photosensing transistor may be efficiently exposed to light, a method of manufacturing the same, and an optical touch display panel employing the photosensing transistor.

Additional aspects will be set forth in part in the description which follows and, in part, will be apparent from the description, or may be learned by practice of the presented embodiments.

According to example embodiments, a photosensing transistor includes a gate layer, a gate insulation layer on the gate layer, a channel layer on the gate insulation layer, an etch stop layer on a partial area of the channel layer, a source and a drain on the channel layer and separated from each other, wherein the etch stop layer is interposed between the source and the drain, and a passivation layer covering the source, the drain, and the etch stop layer, wherein the source is separated from the etch stop layer.

A region of the channel layer corresponding to a space between the source and the etch stop layer may have a conductivity higher than any other region of the channel layer.

The source and the drain may be formed of a transparent electrode material.

The source and the drain may be formed of a metal material.

The drain may be separated from the etch stop layer.

A region of the channel layer corresponding to a space between the drain and the etch stop layer may have a conductivity higher than any other region of the channel layer.

The source and the drain may be formed of a transparent electrode material.

The source and the drain may be formed of a metal material.

The channel layer may be formed of an oxide including at least one selected from indium (In), gallium (Ga), zinc (Zn), aluminum (Al) and a combination thereof.

The channel layer may be formed of a semiconductor material.

According to example embodiments, an optical touch display panel includes a display cell configured to be controlled between an on state and an off state according to image information, and the photosensing transistor described above, wherein the photosensing transistor is configured to sense incident light.

The drain may be separated from the etch stop layer.

The source and the drain may be formed of a transparent electrode material.

The source and the drain may be formed of a metal material.

The display cell may include a liquid crystal material.

According to example embodiments, a method of manufacturing a photosensing transistor includes sequentially forming a gate insulation layer and a channel layer formed of a semiconductor material on a gate layer, forming an etch stop layer in a partial area of the channel layer, forming a conductive material layer to entirely cover the channel layer and the etch stop layer, etching a partial area of the conductive material layer to expose the etch stop layer, wherein the conductive material layer is separated into a source and a drain, and the source is formed separated from the etch stop layer, and forming a passivation layer to cover the source, the drain and the etch stop layer.

The conductive material layer may be formed of a transparent electrode material.

The conductive material layer may be formed of a metal material.

The drain may be separated from the etch stop layer.

The channel layer may be formed of an oxide including at least one selected from indium (In), gallium (Ga), zinc (Zn), aluminum (Al) and a combination thereof. The channel layer may be formed of a semiconductor material.

BRIEF DESCRIPTION OF THE DRAWINGS

These and/or other aspects will become apparent and more readily appreciated from the following description of example embodiments, taken in conjunction with the accompanying drawings in which:

FIG. 7 is a cross-sectional view schematically illustrating a structure of a display panel according to example embodiments; and FIG. 8 is a cross-sectional view schematically illustrating a structure of a display panel according to example embodiments.

DETAILED DESCRIPTION

Figure 1:
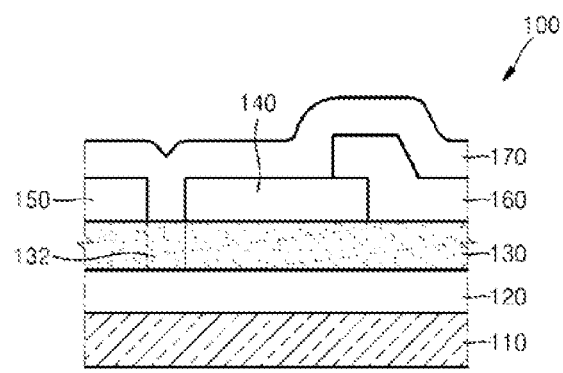
FIG. 1 is a cross-sectional view schematically illustrating a structure of a photosensing transistor according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to photosensing transistors, methods of manufacturing the same, and display panels employing a photosensing transistor.

FIG. 1 is a cross-sectional view schematically illustrating a structure of a photosensing transistor according to example embodiments.

Referring to FIG. 1, a photosensing transistor 100 according to example embodiments includes a gate layer 110, a gate insulation layer 120 formed on the gate layer 110, a channel layer 130 formed on the gate insulation layer 120 and formed of a semiconductor material, an etch stop layer 140 formed in a partial area on the channel layer 130, a source 150 and a drain 160 formed separated from each other on the channel layer 130 with the etch stop layer 140 interposed therebetween, and a passivation layer 170 entirely covering the source 150, the drain 160, and the etch stop layer 140.

The photosensing transistor 100 includes the source 150 and the drain 160 in an asymmetrical form. In other words, when the source 150 is separated from the etch stop layer 140, the drain 160 contacts upper and lateral surfaces of the etch stop layer 140.

The above structure of the photosensing transistor 100 improves efficiency of sensing incident light and increases an area of the channel layer 130 to be exposed to the incident light as much as possible.

Figure 2A:
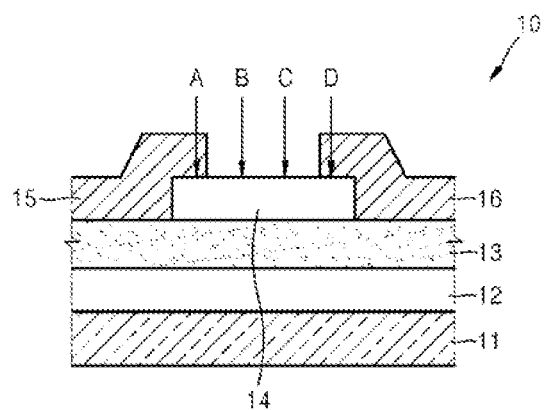
FIGS. 2A and 2B are a cross-sectional view of a structure of a photosensing transistor according to a comparative example and a graph of photocurrent according to beam position, respectively.
Figure 2B:
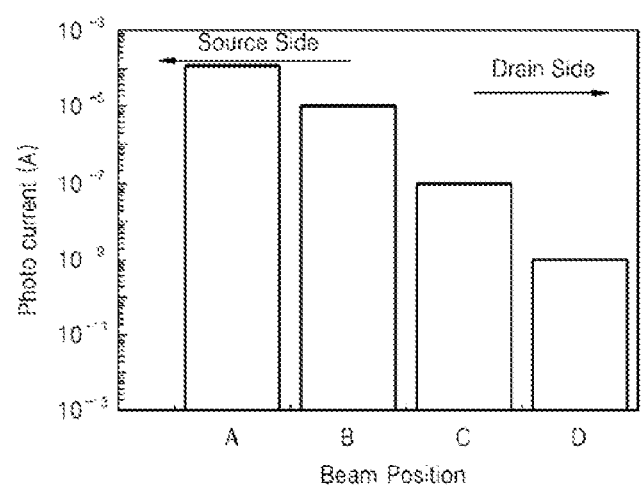

FIGS. 2A and 2B are a cross-sectional view of a structure of a photosensing transistor according to a comparative example and a graph of photocurrent according to beam position, respectively.

Referring to FIGS. 2A and 2B, a photosensing transistor 10 according to a comparative example includes a gate 11, a gate insulation layer 12, a channel layer 13, an etch stop layer 14, a source 15, and a drain 16. The source 15 and the drain 16 have a symmetrical shape and are formed in contact with the etch stop layer 14, respectively from both sides of an upper surface of the etch stop layer 14 to the opposite lateral surfaces of the etch stop layer 14. When light is incident on the photosensing transistor 10 with the above-described structure, incident light passes through the source 15 or the drain 16, and the etch stop layer 14 and is incident on the channel layer 13 so that a light loss occurs. In particular, the subject inventors found through experiments that photocurrent varies according to a beam position. In other words, referring to FIG. 2B, the photosensing transistor 10 appears to be more sensitive to light incident on the side of the source 15.

In consideration of the above, in the photosensing transistor 100 according to example embodiments, the source 150 is formed separated from the etch stop layer 140 so that light may be more incident in the area of the channel layer 130 adjacent to the source 150. Details on the materials of the photosensing transistor 100 are described below.

The gate layer 110 may be formed of a metal material exhibiting a superior electric conductivity, for example, platinum (Pt), ruthenium (Ru), gold (Au), silver (Ag), molybdenum (Mo), aluminum (Al), tungsten (W), copper (Cu) or a combination thereof.

The gate insulation layer 120 may be formed of an insulation material, (e.g., silicon oxide or silicon nitride). For example, $SiO_2$, or a high-K material having a higher dielectric constant than that of $SiO_2$ (e.g., $HfO_2$, $Al_2O_3$, $Si_3N_4$, or a combination thereof), may be used for the gate insulation layer 120. Alternatively, a dual-layer film formed of the above materials may be used for the gate insulation layer.

The channel layer 130 may be formed of an oxide semiconductor. A transistor formed of an oxide semiconductor is widely accepted as a device having both features of an amorphous silicon thin film transistor (a-Si TFT) and a polycrystalline TFT (poly-Si TFT). For example, because a ZnO-based semiconductor device may be manufactured in a low-temperature process and is in an amorphous state, it is easy to make the ZnO-based semiconductor device in a large size. Also, a ZnO-based semiconductor film, which is a material having a high mobility, has a very superior electric feature like poly-Si. The channel layer 130 may be formed of an oxide including indium (In), gallium (Ga), zinc (Zn), aluminum (Al) or a combination thereof. For example, an oxide semiconductor material (e.g., ZnO, InO, SnO, InZnO, ZnSnO, InSnO, etc.) may be used for the channel layer 130. Alternatively, a mixed material obtained by adding one or more of materials such as hafnium (Hf), zirconium (Zr), titanium (Ti), tantalum (Ta), gallium (Ga), niobium (Nb), vanadium (V), aluminum (Al), tin (Sn), etc. to the above-described oxide semiconductor material may be used for the channel layer 130. The channel layer 130 may be formed as a single layer, or in a multi-layer structure, in order to improve the performance and reliability of the photosensing transistor 100.

The etch stop layer 140 prevents the channel layer 130 from being exposed to etching during an etching process in which a conductive material is formed on the channel layer 130 and etched to form the source 150 and the drain 160 contacting the channel layer 130, thereby preventing damage to the channel layer 130. The etch stop layer 140 may be formed of, for example, silicon oxide, silicon nitride, an organic insulation material or a combination thereof.

The source 150 and the drain 160 may be formed of a conductive material. Also, the source 150 and the drain 160 may be formed of a transparent conductive oxide that is a transparent electrode material (e.g., indium zinc oxide (IZO), indium tin oxide (ITO) or a combination thereof) to reduce a loss of light incident on the channel layer 130.

The passivation layer 170 may be formed of silicon nitride or silicon oxide.

In the above-described structure, a region 132 of the channel layer 130 corresponding to a space between the source 150 and the etch stop layer 140 has a higher conductivity than any other region of the channel layer 130. As the source 150 and the etch stop layer 140 are separated from each other, when the passivation layer 170 is formed, hydrogen atoms are injected into a region of the channel layer 130, the region directly contacting the passivation layer 170. The hydrogen atoms supply electric charges and thus a charge concentration of a portion of the channel layer 130 where the electric charges are supplied increases so that the portion becomes a high conductive area, the region 132.

Figure 3:
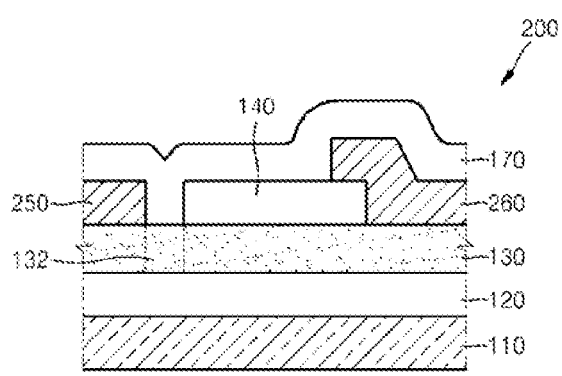
FIG. 3 is a cross-sectional view schematically illustrating a structure of a photosensing transistor according to example embodiments.

FIG. 3 is a cross-sectional view schematically illustrating a structure of a photosensing transistor according to example embodiments Referring to FIG. 3, like the photosensing transistor 100 of FIG. 1, a source 250 and a drain 260 are asymmetrically formed in a photosensing transistor 200 according to the present example embodiments. However, the photosensing transistor 200 is different from the photosensing transistor 100 of FIG. 1 in that the source 250 and the drain 260 are formed of a metal material. The source 250 and the drain 260 may be formed of a material such as platinum (Pt), ruthenium (Ru), gold (Au), silver (Ag), molybdenum (Mo), aluminum (Al), tungsten (W), copper (Cu) or a combination thereof. When the source 250 and the drain 260 are formed of a metal material, more light is loss compared to a case of using a transparent conductive oxide. However, electric conductivity is very high so that resistance of a device is reduced.

Figure 4:
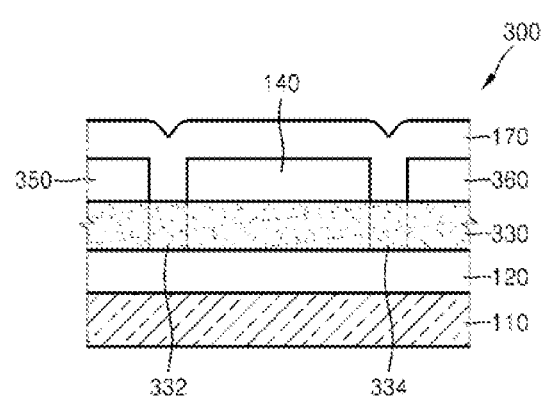
FIG. 4 is a cross-sectional view schematically illustrating a structure of a photosensing transistor according to example embodiments.

FIG. 4 is a cross-sectional view schematically illustrating a structure of a photosensing transistor according to example embodiments.

Referring to FIG. 4, in a photosensing transistor 300 according to example embodiments, both of a source 350 and a drain 360 do not contact the etch stop layer 140 and are separated from each other. Accordingly, an area 332 corresponding to a space between the source 350 and the etch stop layer 140, and an area 334 corresponding to a space between the drain 360 and the etch stop layer 140, become regions where conductivity is higher than any other region of a channel layer. Because both of the source 350 and the drain 360 are separated from the etch stop layer 140, an exposed area of the channel layer 330 increases. Also, because the source 350 and the drain 360 are formed of a transparent conductive oxide, a light loss may be reduced.

Figure 5:
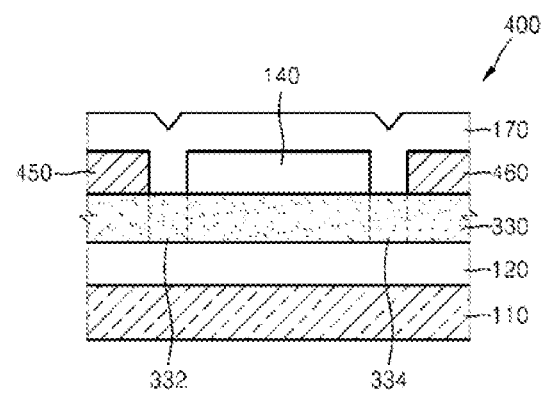
FIG. 5 is a cross-sectional view schematically illustrating a structure of a photosensing transistor according to example embodiments.

FIG. 5 is a cross-sectional view schematically illustrating a structure of a photosensing transistor according to example embodiments.

Referring to FIG. 5, a photosensing transistor 400 according to example embodiments is different from the photosensing transistor 400 of FIG. 4 in that a source 450 and a drain 460 are formed of a metal material.

FIGS. 6A to 6G are cross-sectional views for explaining a method of manufacturing a photosensing transistor, according to example embodiments.

Figure 6A:
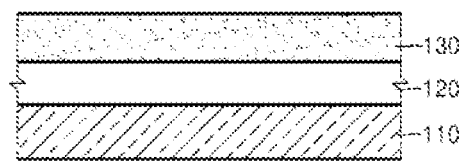
FIGS. 6A to 6G are cross-sectional views for explaining a method of manufacturing a photosensing transistor, according to example embodiments.

Referring to FIG. 6A, the gate insulation layer 120 and the channel layer 130, which are formed of a semiconductor material, are sequentially formed on the gate layer 110. The gate insulation layer 120 may be formed of a metal material exhibiting a superior electric conductivity (e.g., platinum (Pt), ruthenium (Ru), gold (Au), silver (Ag), molybdenum (Mo), aluminum (Al), tungsten (W), copper (Cu) or a combination thereof).

The gate insulation layer 120 may be formed of an insulation material (e.g., silicon oxide, silicon nitride or a combination thereof). For example, $SiO_2$, or a high-K material having a higher dielectric constant than that of $SiO_2$ (e.g., $HfO_2$, $Al_2O_3$, $Si_3N_4$, or a combination thereof), may be used for the gate insulation layer 120. Alternatively, a dual-layer film formed of the above materials may be used for the gate insulation layer 120.

The channel layer 130 may be formed of an oxide semiconductor. The channel layer 130 may be formed of an oxide including indium (In), gallium (Ga), zinc (Zn), aluminum (Al) or a combination thereof. For example, an oxide semiconductor material such as ZnO, InO, SnO, InZnO, ZnSnO, InSnO, etc. may be used for the channel layer 130. Alternatively, a mixed material obtained by adding one or more of materials such as hafnium (Hf), zirconium (Zr), titanium (Ti), tantalum (Ta), gallium (Ga), niobium (Nb), vanadium (V), aluminum (Al), tin (Sn), etc. to the above-described oxide semiconductor material may be used for the channel layer 130. Although the channel layer 130 is illustrated as a single layer, it is merely an example and the channel layer 130 may be formed in a multi-layer structure.

Figure 6B:
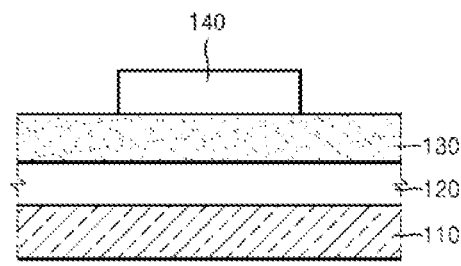

Referring to FIG. 6B, the etch stop layer 140 is formed in a partial area on the channel layer 130. The etch stop layer 140 prevents the channel layer 130 from being exposed to etching during an etching process in which a conductive material is formed on the channel layer 130 and etched to form the source 150 and the drain 160 contacting the channel layer 130, thereby preventing damage to the channel layer 130. The etch stop layer 140 may be formed of, for example, silicon oxide, silicon nitride, an organic insulation material or a combination thereof.

Figure 6C:
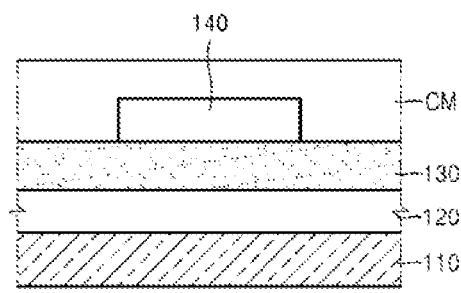

Referring to FIG. 6C, a conductive material layer CM is formed to entirely cover the channel layer 130 and the etch stop layer 140. The conductive material layer CM may be formed of a transparent conductive oxide or a metal material.

Figure 6D:
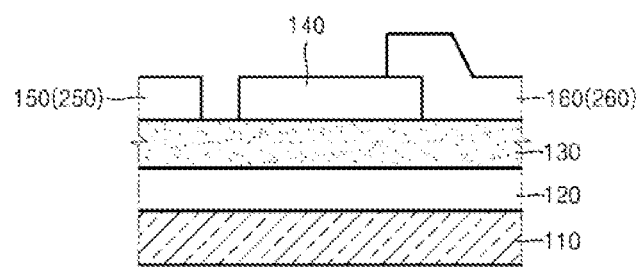

Referring to FIG. 6D, the conductive material layer CM is etched to form the source 150 (250) and the drain 160 (260). In other words, a partial area of the conductive material layer CM is etched to reveal the etch stop layer 140 so that the conductive material layer CM is divided into the source 150 (250) and the drain 160 (260). In doing so, the source 150 (250) is formed separated from the etch stop layer 140.

Figure 6E:
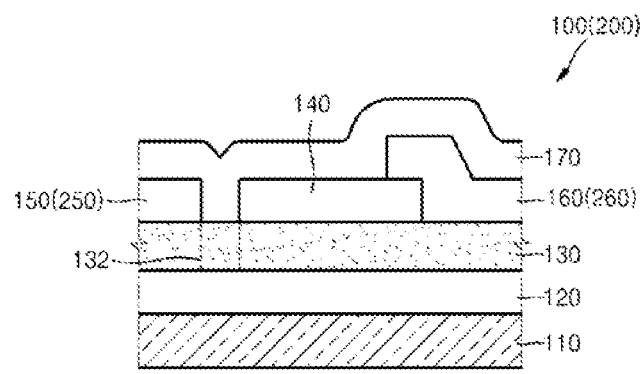

Referring to FIG. 6E, the passivation layer 170 is formed to entirely cover the source 150 (250), the drain 160 (260), and the etch stop layer 140. As a result, the photosensing transistor 100 (200) having the above-described structure as illustrated in FIG. 1 (3) is manufactured.

Figure 6F:
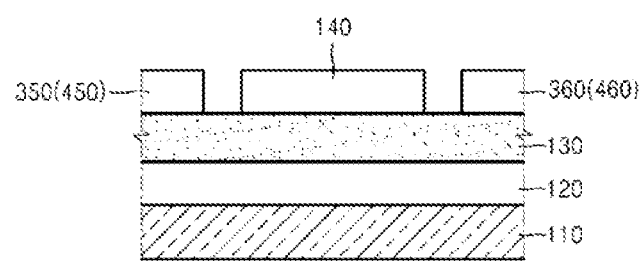
Figure 6G:
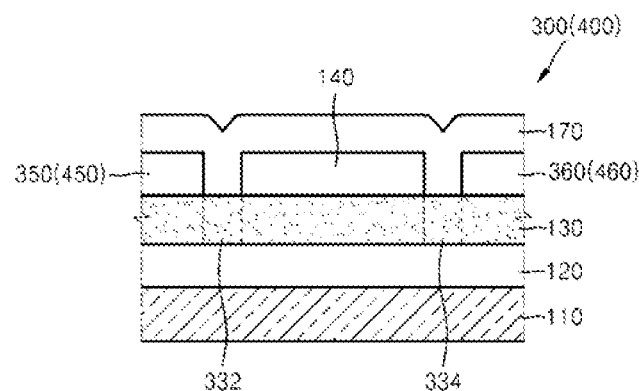

The etching process of FIG. 6D may be modified to the process of FIGS. 6F and 6G in which the source 350 (450) and the drain 360 (460) are both separated from the etch stop layer 140, and the passivation layer 170 is formed to entirely cover the source 350 (450), the drain 360 (460), and the etch stop layer 140. Accordingly, the photosensing transistors 300 and 400 having the above-described structures illustrated in FIGS. 4 and 5 are manufactured.

The above-described photosensing transistors have high photosensing efficiency because the source/drain structure is improved so that the entire area of the channel layer may be exposed to light well. The photosensing transistors may be applied to a display panel having an optical touch function.

FIG. 7 is a cross-sectional view schematically illustrating a structure of an optical touch display panel according to example embodiments.

Referring to FIG. 7, an optical touch display panel 500 according to example embodiments includes a plurality of pixels, each including display cell 560 that is on/off controlled according to image information and the photosensing transistor 100 (200) for sensing incident light. In FIG. 7, only one pixel is illustrated. However, example embodiments are not limited thereto.

In a detailed structure of the optical touch display panel 500, the optical touch display panel 500 includes a transparent rear substrate 510 and a transparent front substrate 570, arranged facing to each other, and the display cell 560 provided between the rear substrate 510 and the front substrate 570.

The display cell 560 may be a liquid crystal cell formed of a liquid crystal material. A first alignment layer 542 and a second alignment layer 548 may be formed on lower and upper surfaces of the display cell 560, respectively, to improve an interfacial property and an alignment characteristic of liquid crystal. Also, a first polarization plate 582 and a second polarization plate 584 may be arranged on a lower surface of the rear substrate 510 and an upper surface of the front substrate 570, respectively.

A color filter 552, a passivation layer 539, and a first transparent electrode layer 536 are sequentially formed under a lower surface of the front substrate 570. The photosensing transistor 100 (200) having the structure as described with reference to FIG. 1 (2) is provided on an upper surface of the rear substrate 510. The drain 160 (360) is connected to a second transparent electrode layer 533 by passing through the passivation layer 170.

Also, although it is not illustrated in FIG. 7, a driving transistor for controlling on/off of the display cell 260 may be provided on the upper surface of the rear substrate 510. The driving transistor may have the same structure as the photosensing transistor 100 (200), or as the photosensing transistor 10 according to the comparative example.

Because the optical touch display panel 500 employs the photosensing transistor 100 (200) having a structure in which an area of the channel layer 130 to be exposed to incident light is increased as much as possible, photosensing efficiency of the optical touch display panel 500 is high. Furthermore, the first and second polarization plates 582 and 584 are essentially provided in the example embodiments employing the display cell 560 formed of liquid crystal. However, considering that a large amount of incident light input to the front side is lost at the second polarization plate 584, it is important to include the photosensing transistor 100 (200) having high light efficiency.

FIG. 8 is a cross-sectional view schematically illustrating a structure of an optical touch display panel according to example embodiments.

Referring to FIG. 8, an optical touch display panel 600 according to example embodiments is different from the optical touch display panel 500 of FIG. 7 in that the photosensing transistor 300 (400) having the structure described with reference to FIGS. 4 and 5 is employed.

It should be understood that the example embodiments described therein should be considered in a descriptive sense only and not for purposes of limitation. Descriptions of features or aspects within each embodiment should typically be considered as available for other similar features or aspects in other example embodiments.

What is claimed is:

1. A photosensing transistor, comprising:
   a gate layer;
   a gate insulation layer on the gate layer;
   a channel layer on the gate insulation layer;
   an etch stop layer on a partial area of the channel layer;
   a source and a drain on the channel layer and physically separated from each other in a desired direction, wherein the etch stop layer is interposed between the source and the drain; and
   a passivation layer covering the source, the drain and the etch stop layer,
   wherein the source is physically separated from the etch stop layer by the passivation layer in the desired direction,
   wherein a region of the channel layer corresponding to a space created by the physical separation between the source and the etch stop layer has a conductivity higher than any other region of the channel layer.

2. The photosensing transistor of claim 1, wherein the source and the drain are formed of a transparent electrode material.

3. The photosensing transistor of claim 1, wherein the source and the drain are formed of a metal material.

4. The photosensing transistor of claim 1, wherein the drain is separated from the etch stop layer in the desired direction.

5. The photosensing transistor of claim 4, wherein a region of the channel layer corresponding to a space between the drain and the etch stop layer has a conductivity higher than any other region of the channel layer.

6. The photosensing transistor of claim 4, wherein the source and the drain are formed of a transparent electrode material.

7. The photosensing transistor of claim 4, wherein the source and the drain are formed of a metal material.

8. The photosensing transistor of claim 1, wherein the channel layer is formed of an oxide including at least one selected from indium (In), gallium (Ga), zinc (Zn), aluminum (Al) and a combination thereof.

9. The photosensing transistor of claim 1, wherein the channel layer is formed of a semiconductor material.

10. An optical touch display panel, comprising:
    a display cell configured to be controlled between an on state and an off state according to image information; and
    a photosensing transistor, including,
      a gate layer,
      a gate insulation layer on the gate layer,
      a channel layer on the gate insulation layer,
      an etch stop layer on a partial area of the channel layer,
      a source and a drain on the channel layer and physically separated from each other in a desired direction, wherein the etch stop layer is interposed between the source and the drain, and
      a passivation layer covering the source, the drain and the etch stop layer, wherein the source is physically separated from the etch stop layer by the passivation layer in the desired direction,
    wherein a region of the channel layer corresponding to a space created by the physical separation between the source and the etch stop layer has a conductivity higher than any other region of the channel layer, and
    wherein the photosensing transistor is configured to sense incident light.

11. The optical touch display panel of claim 10, wherein the drain is separated from the etch stop layer in the desired direction.

12. The optical touch display panel of claim 10, wherein the source and the drain are formed of a transparent electrode material.

13. The optical touch display panel of claim 10, wherein the source and the drain are formed of a metal material.

14. The optical touch display panel of claim 10, wherein the display cell includes a liquid crystal material.

15. A method of manufacturing a photosensing transistor, the method comprising:
    sequentially forming a gate insulation layer and a channel layer on a gate layer;
    forming an etch stop layer on a partial area of the channel layer;
    forming a conductive material layer to entirely cover the channel layer and the etch stop layer;
    etching a partial area of the conductive material layer to (i) expose the etch stop layer, (ii) separate the conductive material layer into a source and a drain, the source and drain being physically separated in a desired direction, and (iii) physically separate the source from the etch stop layer in the desired direction; and
    forming a passivation layer to cover the source, the drain, and the etch stop layer such that a region of the channel layer corresponding to a space created by the physical separation between the source and the etch stop layer has a conductivity higher than any other region of the channel layer.

16. The method of claim 15, wherein the forming a conductive material layer forms the conductive material layer of a transparent electrode material.

17. The method of claim 15, wherein the forming a conductive material layer forms the conductive material layer of a metal material.

18. The method of claim 15, wherein the etching is performed such that the drain is separated from the etch stop layer in the desired direction.

19. The method of claim 15, wherein the sequentially forming forms the channel layer of an oxide including at least one selected from indium (In), gallium (Ga), zinc (Zn), aluminum (Al) and a combination thereof.

20. The method of claim 15, wherein the sequentially forming forms the channel layer of a semiconductor material.

* * * * *